(12) United States Patent
Gion et al.

(10) Patent No.: US 6,681,355 B1
(45) Date of Patent: Jan. 20, 2004

(54) ANALOG BOUNDARY SCAN COMPLIANT INTEGRATED CIRCUIT SYSTEM

(75) Inventors: Masahiro Gion, Kyoto (JP); Masaya Hirose, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/538,260

(22) Filed: Mar. 30, 2000

(30) Foreign Application Priority Data

Apr. 2, 1999 (JP) .......................................... 11-096103

(51) Int. Cl.[7] .......................... G01R 31/28; G01R 19/00
(52) U.S. Cl. .......................... 714/727; 714/740; 327/56; 327/72
(58) Field of Search .......................... 714/727, 25, 27, 714/30, 43, 44, 48, 56, 724, 726, 729, 731, 732, 733, 734, 735, 736, 740, 742, 744, 745; 327/40, 56, 72, 74, 90; 326/35

(56) References Cited

U.S. PATENT DOCUMENTS

| | | | | |
|---|---|---|---|---|
| 4,395,767 A | * | 7/1983 | Van Brunt et al. | 714/736 |
| 5,517,515 A | * | 5/1996 | Spall et al. | 714/733 |
| 5,576,554 A | * | 11/1996 | Hsu | 257/48 |
| 5,602,855 A | * | 2/1997 | Whetsel, Jr. | 714/727 |
| 5,631,911 A | * | 5/1997 | Whetsel, Jr. | 714/727 |
| 5,670,890 A | | 9/1997 | Colwell et al. | |
| 5,760,428 A | * | 6/1998 | Colwell et al. | 257/206 |
| 5,963,046 A | * | 10/1999 | Konuk | 324/765 |
| 5,970,375 A | * | 10/1999 | Gardner et al. | 438/637 |
| 6,081,916 A | * | 6/2000 | Whetsel, Jr. | 714/727 |
| 6,099,580 A | * | 8/2000 | Boyle et al. | 716/7 |
| 6,222,212 B1 | * | 4/2001 | Lee et al. | 257/207 |

FOREIGN PATENT DOCUMENTS

| | | |
|---|---|---|
| JP | 55-39056 | 3/1980 |
| JP | 2-154522 | 6/1990 |
| JP | 6-242178 | 9/1994 |
| JP | 8-68811 | 3/1996 |
| JP | 9-264929 | 10/1997 |

OTHER PUBLICATIONS

P1149.4 Standard for a Mixed–Signal Test Bus—D18 Jun. 30, 1998—Institute of Electrical Electronics Engineers, Inc.

* cited by examiner

Primary Examiner—Albert Decady
Assistant Examiner—Matthew C. Dooley
(74) Attorney, Agent, or Firm—McDermott, Will & Emery

(57) ABSTRACT

An anlog boundary scan compliant integrated circuit system carries out a test more reliably and cuts down on power dissipated during normal operation. To perform a test of whether or not an interconnect is connected normally between integrated circuits, multiple logic circuits with mutually different input threshold voltages are provided to detect the logical level of a potential at a terminal, thereby improving the reliability of the test. Potential fixers and power isolators are optionally provided. During normal operation, the power fixers fix the output potentials of the logic circuits, while the power isolators electrically isolate the logic circuits from the ground. As a result, no current flows through the logic circuits or other circuits in succeeding stages while no tests are carried out.

10 Claims, 6 Drawing Sheets

ANALOG BOUNDARY SCAN COMPLIANT INTEGRATED CIRCUIT SYSTEM

BACKGROUND OF THE INVENTION

The present invention relates to an integrated circuit system with analog boundary scan capabilities.

An electronic unit has further reduced its size and weight along with recent upsurge in number of electronic components integrated together within the electronic unit. Such a densely packed and miniaturized electronic unit, however, also has a downside. For example, the smaller the electronic unit, the more difficult it is to test the unit.

To make such a unit testable more easily, a test system called "analog boundary scan (ABS) test system" was proposed in compliance with the IEEE standard No. P1149.4. In the ABS test system, a tester is provided within each integrated circuit to test the performance of the integrated circuit itself or interconnection with other integrated circuits on a circuit board after the circuits have been mounted on the board.

The IEEE P1149.4 standard recommends that an integrated circuit should be tested by simply checking interconnection among integrated circuits including the one under the test. For that purpose, a logic circuit should be provided within the integrated circuit to detect potentials at respective connection terminals. Specifically, this method is carried out in the following manner.

FIG. 7 illustrates one of known ABS compliant integrated circuit systems. As shown in FIG. 7, an interconnect 3 is provided to connect two integrated circuits 1 and 2 together. A digital or analog signal, which is output from a driver 6 included in the integrated circuit 2, is passed through a terminal 5, the interconnect 3 and another terminal 4 and then transmitted to a receiver 7 included in the integrated circuit 1. A logic circuit 51, the input of which is connected to the terminal 4 to check how the interconnect 3 is connected by detecting a potential at the terminal 4, is also provided for the integrated circuit 1. In the example illustrated in FIG. 7, the logic circuit 51 is implemented as a CMOS inverter 51 applying a predetermined threshold voltage to the terminal 4.

In FIG. 7, the interconnect 3 is tested by getting respective voltages, which are higher and lower than the threshold voltage applied from the logic circuit 51, output from the driver 6 and making the logic circuit 51 check whether or not these output voltages are received at the terminal 4 as expected. In this specification, these voltages, which are higher and lower than the input threshold voltage, will be called "H-level" and "L-level" voltages, respectively.

First, suppose the H-level voltage is output from the driver 6. In this case, if the interconnect 3 is connected normally, then the H-level voltage is transmitted to the terminal 4 and the logic circuit 51 receives and inverts the H-level voltage at the terminal 4 to output an L-level voltage. Next, suppose the L-level voltage is output from the driver 6. In such a case, if the interconnect 3 is connected normally, then the L-level voltage is transmitted to the terminal 4 and the logic circuit 51 receives and inverts the L-level voltage at the terminal 4 to output an H-level voltage.

Since the inverter is used as the logic circuit 51 in the example shown in FIG. 7, the connectivity of the interconnect 3 can be checked by seeing whether or not the output of the logic circuit 51 is opposite to that of the driver 6.

However, suppose the interconnect 3 is not connected normally (e.g., the interconnect 3 is short-circuited with the power supply). In such a situation, even if the L-level voltage has been output from the driver 6, the logic circuit 51 outputs an L-level voltage, because the potential at the terminal 4 is fixed at the supply potential. That is to say, since the output of the logic circuit 51 is not opposite to that of the driver 6, it is determined that the interconnect 3 is not connected normally. Also, suppose the interconnect 3 is short-circuited with the ground. In such a situation, even if the H-level voltage has been output from the driver 6, the logic circuit 51 outputs an H-level voltage, because the potential at the terminal 4 is fixed at the ground potential. That is to say, since the output of the logic circuit 51 is not opposite to that of the driver 6 either, it is also determined that the interconnect 3 is not connected normally.

In the prior art test system, however, the connectivity of the interconnect cannot always be tested correctly.

For example, suppose the interconnect 3 is short-circuited with the power supply via a resistor as shown in FIG. 8($a$). In such a situation, even if an L-level voltage has been output from the driver 6, the potential at the terminal 4 might be lower than the input threshold voltage of the logic circuit 51 depending on an impedance ratio between the driver 6 and the resistor. Then, the logic circuit 51 outputs an H-level voltage, which is opposite to the output voltage of the driver 6, and it is determined by mistake that the interconnect 3 is connected normally. That is to say, the short-circuited between the interconnect 3 and the power supply cannot be detected in such a case.

The same statement is also true of a situation where the interconnect 3 is short-circuited with the ground via a resistor as shown in FIG. 8($b$). In this case, even if an H-level voltage has been output from the driver 6, the potential at the terminal 4 might be higher than the input threshold voltage of the logic circuit 51 depending on an impedance ratio between the driver 6 and the resistor. Then, the logic circuit 51 outputs an L-level voltage, which is opposite to the output voltage of the driver 6, and it is also determined by mistake that the interconnect 3 is connected normally. That is to say, the short-circuited between the interconnect 3 and the ground cannot be detected, either.

Furthermore, suppose the interconnect 3 has been disconnected as shown in FIG. 8($c$) and there is coupled capacitance between the disconnected interconnect 3 and a second interconnect (not shown). In such a situation, the potential at the terminal 4 is affected by the potential on the second interconnect and therefore, is inconstant and variable. Thus, if the potential on the second interconnect changes in the same way as the output voltage of the driver 6, then it is determined by mistake that the interconnect 3 is connected normally. This is because the potential at the terminal 4 is affected by the potential variation on the second interconnect. That is to say, the disconnection cannot be detected.

In addition, the prior art test system dissipates power for nothing during normal operation even though no test is being carried out. For example, during normal operation, an analog signal may pass through the interconnect 3 and therefore the potential at the terminal 4 often reaches an intermediate potential close to the input threshold voltage of the logic circuit 51. As a result, current frequently flows through the logic circuit 51, thus unnecessarily increasing power dissipation during the normal operation.

SUMMARY OF THE INVENTION

It is therefore an object of the present invention to test an analog boundary scan-compliant integrated circuit system more reliably. A more specific object of the present invention is to reduce power dissipation during the normal operation of the system.

Specifically, an inventive integrated circuit system with analog boundary scan capabilities includes: first and second integrated circuits; and an interconnect provided between the first and second integrated circuits to connect these circuits together. The first integrated circuit includes: a terminal to which the interconnect is connected; and multiple logic circuits with mutually different input threshold voltages. Each said logic circuit detects a logical level of a potential at the terminal to carry out a test of whether the interconnect is connected normally.

According to the present invention, the logical level of a potential at the terminal is detected by multiple logic circuits with mutually different input threshold voltages. Thus, even if one of the logic circuits with a certain input threshold voltage cannot detect the potential at the terminal correctly because the interconnect has been short-circuited or disconnected, another one of the logic circuits with a different input threshold voltage is more likely to detect the potential correctly. As a result, the test can be carried out more reliably.

Another inventive integrated circuit system with analog boundary scan capabilities includes: first and second integrated circuits; and an interconnect provided between the first and second integrated circuits to connect these circuits together. The first integrated circuit includes a terminal to which the interconnect is connected and a logic circuit for detecting a logical level of a potential at the terminal to carry out a test of whether the interconnect is connected normally. The first integrated circuit further includes means for fixing an output potential of the logic circuit and means for electrically isolating at least one of power supply and ground from the logic circuit to block current from flowing through the logic circuit while the test is not carried out using the logic circuit.

According to the present invention, even if an intermediate potential close to the input threshold voltage of the logic circuit has been received at the terminal during normal operation, the isolating means blocks current from flowing through the logic circuit. Also, since the fixing means fixes the output potential of the logic circuit, circuits on succeeding stages do not operate, thus reducing the power dissipation during the normal operation.

In one embodiment of the present invention, an input threshold voltage of the logic circuit may be defined depending on respective sizes of the fixing and isolating means. In this particular embodiment, at least one logic circuit is preferably provided in addition to the logic circuit. The former logic circuit is functionally equivalent to the latter logic circuit. Each of the logic circuits is preferably associated with the fixing and isolating means individually. And mutually different input threshold voltages are preferably defined for the logic circuits depending on respective sizes of the associated fixing and isolating means.

Still another inventive integrated circuit system with analog boundary scan capabilities includes: first and second integrated circuits; and an interconnect provided between the first and second integrated circuits to connect these circuits together. The first integrated circuit includes: a terminal to which the interconnect is connected; a logic circuit for detecting a logical level of a potential at the terminal to carry out a test of whether the interconnect is connected normally; and a pull-up or pull-down device connected to an input of the logic circuit.

According to the present invention, if the interconnect has been disconnected, the potential at the terminal is fixed at either the supply or ground potential by the pull-up or pull-down device. Thus, the disconnection of the interconnect can be detected with much more certainty.

In one embodiment of the present invention, the pull-up or pull-down device is preferably isolated electrically from the input of the logic circuit while the test is not carried out using the logic circuit.

In another embodiment of the present invention, the integrated circuit system may further include means for electrically isolating the input of the logic circuit from the terminal while the test is not carried out using the logic circuit.

In every integrated circuit system of the present invention, a gate length of a transistor at an input stage of each said logic circuit is preferably greater than that of another transistor included in the first integrated circuit.

DESCRIPTION OF THE PREFERRED EMBODIMENTS

Hereinafter, preferred embodiments of the present invention will be described with reference to the accompanying drawings.

Embodiment 1

Figure 1:
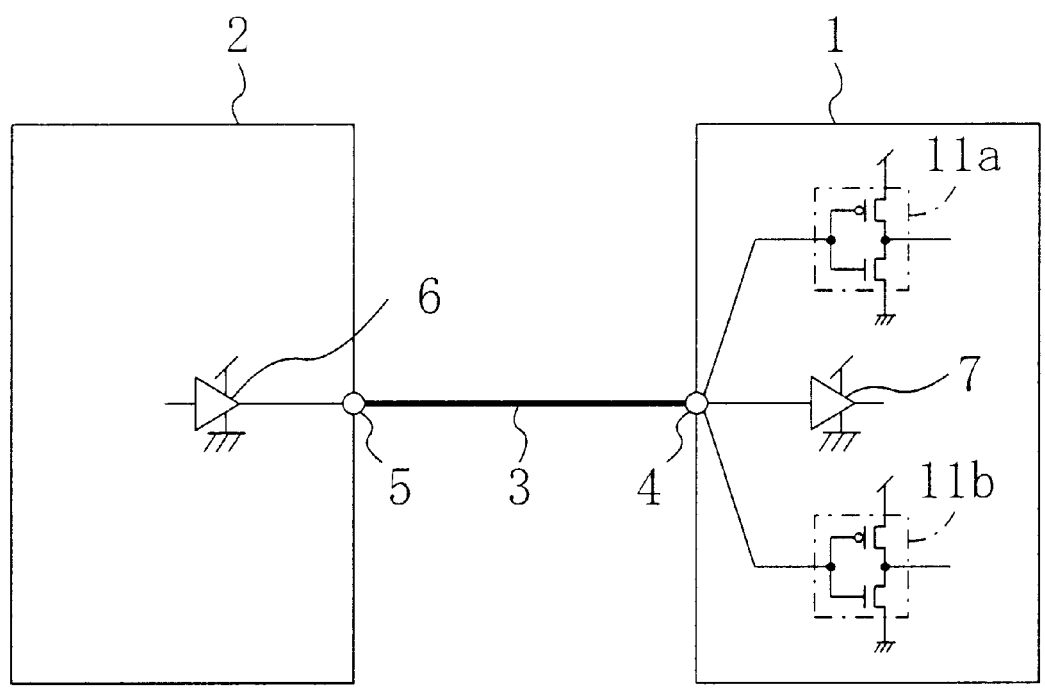
FIGS. 1, 2, 3, 4, 5 and 6 illustrate analog boundary scan (ABS) compliant integrated circuit systems according to first, second, third, fourth, fifth and sixth embodiments of the present invention, respectively.

FIG. 1 illustrates an ABS compliant integrated circuit system according to a first embodiment of the present invention. In FIG. 1, the illustration of various other components not contributing to analog boundary scanning is omitted. As shown in FIG. 1, first and second integrated circuits 1 and 2 are connected together via an interconnect 3 to form the ABS compliant integrated circuit system. The interconnect 3 connects a terminal 4 of the first integrated circuit 1 to a terminal 5 of the second integrated circuit 2. The second integrated circuit 2 includes a driver 6 for sending out a signal to the first integrated circuit 1 through the interconnect 3. The output of the driver 6 is connected to the terminal 5. The first integrated circuit 1 includes a receiver 7 for receiving the signal that has been sent from the second integrated circuit 2 through the interconnect 3. The input of the receiver 7 is connected to the terminal 4.

The first integrated circuit 1 further includes first and second logic circuits 11*a* and 11*b*. The input of each of these logic circuits 11*a* and 11*b* is connected to the terminal 4. Each of these logic circuits 11*a* and 11*b* detects the logical level of a potential at the terminal 4 to carry out a test of whether the interconnect 3 is connected normally. Also, the input threshold voltages of the first and second logic circuits 11*a* and 11*b* are different from each other. In the embodiment illustrated in FIG. 1, these logic circuits 11*a* and 11*b* are implemented as CMOS inverters. In this case, the input threshold voltage of the logic circuit 11*a* or 11*b* is regulable by changing the gate widths or lengths of p- and n-channel MOS transistors included in the CMOS inverter. In the following description, the p- and n-channel MOS transistors will be abbreviated as PMOS and NMOS, respectively.

The first embodiment of the invention is characterized in that multiple logic circuits 11a and 11b are provided for the first integrated circuit 1 to detect the potential at the terminal 4 and that the input threshold voltages of these logic circuits 11a and 11b are different from each other.

Hereinafter, it will be described how the ABS compliant integrated circuit system shown in FIG. 1 operates. In the following example, the supply voltage and input threshold voltages of the first and second logic circuits 11a and 11b are supposed to be 5, 3 and 2 V, respectively.

In testing the connectivity of the interconnect 3 using the system shown in FIG. 1, a signal at a predetermined level is output from the driver 6 and it is determined by the first and second logic circuits 11a and 11b whether or not the output signal has arrived at the terminal 4 as expected. That is to say, if both the first and second logic circuits 11a and 11b output signals at a level opposite to that of the output signal of the driver 6, it is determined that the interconnect 3 is connected normally.

The following Table 1 illustrate relationships between the connectivity of the interconnect 3 and output voltages of the first and second logic circuits 11a and 11b.

TABLE 1

| | Case | Output voltage of Driver 6 | Potential at Terminal 4 | Output voltage of logic circuit 11a | Output voltage of logic Circuit 11b |
|---|---|---|---|---|---|
| Normal | A1 | 5 V | 5 V | 0 V | 0 V |
| | A2 | 0 V | 0 V | 5 V | 5 V |
| Shorted with ground | B1 | 5 V | 2.5 V | 5 V | 0 V |
| | B2 | 0 V | 0 V | 5 V | 5 V |
| Shorted with power supply | C1 | 5 V | 5 V | 0 V | 0 V |
| | C2 | 0 V | 2.5 V | 5 V | 0 V |

First, suppose a voltage of 5 V is output from the driver 6. In this case, if the interconnect 3 is connected normally or if the interconnect 3 is short-circuited with the power supply via a resistor, then the potential at the terminal 4 is 5 V. Since the voltage at the terminal 4 is higher than any of the input threshold voltages of the first and second logic circuits 11a and 11b, the first and second logic circuits 11a and 11b both output a voltage of 0 V (in Cases A1 and C1). On the other hand, suppose the potential at the terminal 4 is not 0 V but 2.5 V when the interconnect 3 is short-circuited with the ground via a resistor. Since this potential is lower than the input threshold voltage of the first logic circuit 11a and higher than that of the second logic circuit 11b, the first logic circuit 11a outputs 5 V, while the second logic circuit 11b outputs 0 V (Case B1).

Next, suppose a voltage of 0 V is output from the driver 6. In this case, if the interconnect 3 is connected normally or if the interconnect 3 is short-circuited with the ground via a resistor, then the potential at the terminal 4 is 0 V. Since the voltage at the terminal 4 is lower than any of the input threshold voltages of the first and second logic circuits 11a and 11b, the first and second logic circuits 11a and 11b both output a voltage of 5 V (in Cases A2 and B2). On the other hand, suppose the potential at the terminal 4 is not 5 V but 2.5 V when the interconnect 3 is short-circuited with the power supply via a resistor. Since this potential is lower than the input threshold voltage of the first logic circuit 11a and higher than that of the second logic circuit 11b, the first logic circuit 11a outputs 5 V, while the second logic circuit 11b outputs 0 V (Case C2).

That is to say, as can be seen from Table 1, if the interconnect 3 is short-circuited with the ground or power supply via the resistor, one of the first and second logic circuits 11a and 11b doe not output a level opposite to that of the output voltage of the driver 6 (Cases B1 and C2). In other words, if at least one of the output levels of the first and second logic circuits 11a and 11b is found not opposite to that of the driver 6 outputting the voltage of 0 or 5 V, then the interconnect 3 is not connected normally.

By getting the terminal potential detected by multiple logic circuits with different input threshold voltages in this manner, the connection fault of the interconnect can be detected even though such a fault would be missed by a single logic circuit. In the foregoing embodiment, two logic circuits are provided. Alternatively, the accuracy of detection may be improved by providing three or more logic circuits.

Embodiment 2

Figure 2:
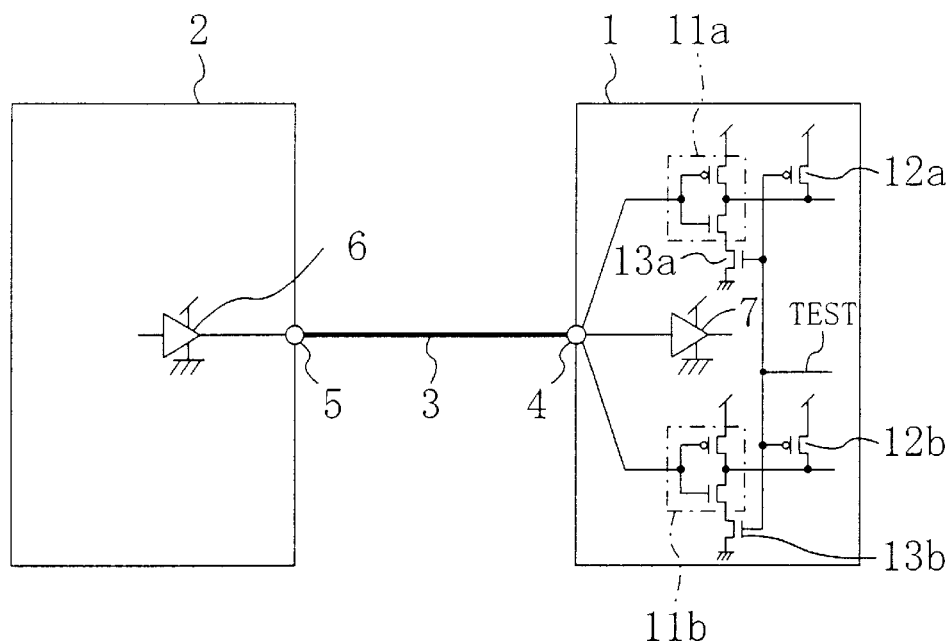

FIG. 2 illustrates an ABS compliant integrated circuit system according to a second embodiment of the present invention. In FIG. 2, the same components as those illustrated in FIG. 1 are identified by the same reference numerals and the detailed description thereof will be omitted herein. In FIG. 2, potential fixers 12a and 12b are provided to fix the output potentials of the logic circuits 11a and 11b during normal operation, i.e., while no test is being carried out using the logic circuits 11a and 11b. In addition, power isolators 13a and 13b are further provided to electrically isolate the logic circuits 11a and 11b from the ground during normal operation, i.e., while no test is being carried out using the logic circuits 11a and 11b.

In the embodiment illustrated in FIG. 2, each of the potential fixers 12a and 12b is implemented as a PMOS, while each of the power isolators 13a and 13b is implemented as an NMOS. A test mode signal TEST, which has been generated and output from a test controller (not shown), is provided to the respective gates of the PMOS's and NMOS's constituting the potential fixers 12a and 12b and the power isolators 13a and 13b. That is to say, the ON/OFF states of the potential fixers 12a, 12b and power isolators 13a, 13b are controlled responsive to the test mode signal TEST.

Hereinafter, it will be described how the ABS compliant integrated circuit system shown in FIG. 2 operates.

First, in carrying out a test of whether the interconnect 3 is connected normally, the test controller asserts the test mode signal TEST logically high. When the test mode signal TEST rises to the H-level, the potential fixers 12a and 12b are both turned OFF, while the power isolators 13a and 13b are both turned ON. As a result, the logic circuits 11a and 11b are connected to the ground via the power isolators 13a and 13b and the potential fixers 12a and 12b do not affect the operation of the logic circuits 11a and 11b anymore. That is to say, in such a state, the system shown in FIG. 2 is functionally equivalent to the system shown in FIG. 1. Accordingly, the connectivity of the interconnect 3 can be tested in the same way as the first embodiment.

On the other hand, during normal operation while no test is carried out, the test controller negates the test mode signal TEST logically low. When the test mode signal TEST is negated, the potential fixers 12a and 12b are turned ON, while the power isolators 13a and 13b are turned OFF. As a result, the logic circuits 11a and 11b are both isolated from the ground by the power isolators 13a and 13b, and the output potentials of the logic circuits 11a and 11b are fixed at the H-level by the potential fixers 12a and 12b.

During normal operation, an analog signal sometimes passes through the interconnect 3 and the potential at the terminal 4 often becomes an intermediate potential close to the input threshold voltages of the logic circuits 11a and 11b. According to this embodiment, however, the logic circuits 11a and 11b are isolated from the ground, and therefore no current flows through the logic circuits 11a and 11b. Also, since the output potentials of the logic circuits 11a and 11b are fixed during the normal operation, circuits on the stages succeeding the logic circuits 11a and 11b do not operate, either.

As can be seen, according to this embodiment, the current flowing through the logic circuits or other circuits on succeeding stages can be cut down during the normal operation.

In the illustrated embodiment, the potential fixers and power isolators are implemented as PMOS's and NMOS's, respectively. Alternatively, any devices may be employed as the potential fixers so long as the output potentials of the logic circuits can be fixed during normal operation. Also, any devices may be employed as the power isolators so long as the current flow through the logic circuits can be blocked during normal operation. Furthermore, the power isolators may be provided either between the logic circuits and the power supply or between one of the logic circuits and the power supply and between the other logic circuit and the ground, respectively.

Embodiment 3

Figure 3:
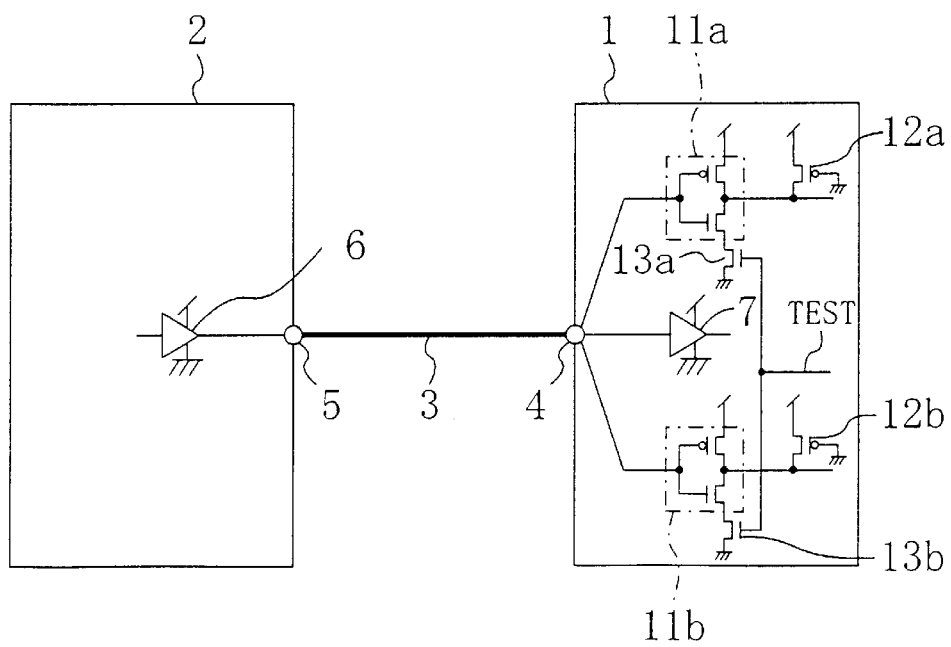

FIG. 3 illustrates an ABS compliant integrated circuit system according to a third embodiment of the present invention. In FIG. 3, the same components as those illustrated in FIG. 2 are identified by the same reference numerals and the detailed description thereof will be omitted herein. The embodiment illustrated in FIG. 3 is different from that illustrated in FIG. 2 in that the respective gates of the PMOS's functioning as the potential fixers 12a and 12b are connected to the ground, instead of being provided with the test mode signal TEST. That is to say, the potential fixers are always ON. However, the potential fixers 12a and 12b have their sizes adjusted to fix the outputs of the logic circuits 11a and 11b only when those logic circuits 11a and 11b are not operating.

Also, the first logic circuit 11a is designed to have smaller input capacitance. The sizes of the potential fixers 12a and 12b are designed to be different from each other. And the sizes of the power isolators 13a and 13b are also designed to be different from each other. Thus, even if the size of a device included in the first logic circuit 11a is equal to that of a counterpart included in the second logic circuit 11b, the input threshold voltages of these logic circuits 11a and 11b are different from each other.

First, in carrying out a test of whether the interconnect 3 is connected normally, the test mode signal TEST is asserted logically high. Then, the power isolators 13a and 13b are both turned ON. As a result, the logic circuits 11a and 11b are electrically connected to the ground. However, in this case, since the potential fixers 12a and 12b do not fix the output potentials of the logic circuits 11a and 11b, the system shown in FIG. 3 is functionally equivalent to the system shown in FIG. 1. Accordingly, the connectivity of the interconnect 3 can be tested in the same way as the first embodiment.

On the other hand, during normal operation while no test is carried out, the test mode signal TEST is negated logically low. Then, the power isolators 13a and 13b are turned OFF. As a result, the logic circuits 11a and 11b are both electrically isolated from the ground, and the output potentials of the logic circuits 11a and 11b are fixed at the H-level by the potential fixers 12a and 12b.

During normal operation, an analog signal sometimes passes through the interconnect 3 and the potential at the terminal 4 often becomes an intermediate potential close to the input threshold voltages of the logic circuits 11a and 11b. According to this embodiment, however, the logic circuits 11a and 11b are isolated from the ground by the power isolators 13a and 13b, and therefore no current flows through the logic circuits 11a and 11b. Also, since the output potentials of the logic circuits 11a and 11b are fixed by the potential fixers 12a and 12b, circuits on the stages succeeding the logic circuits 11a and 11b do not operate, either. Furthermore, since the input capacitance of the logic circuits 11a and 11b is small, the load capacitance connected to the terminal 4 is also small. As a result, the current that will be charged and discharged relative to the load capacitance connected to the terminal 4 is reduced. Accordingly, the normal operation is affected to a lesser degree, e.g., increase in power dissipation can be minimized.

As can be seen, according to the third embodiment, the connectivity of the interconnect can be tested as in the first embodiment and the current flowing during normal operation can be cut down.

Embodiment 4

Figure 4:
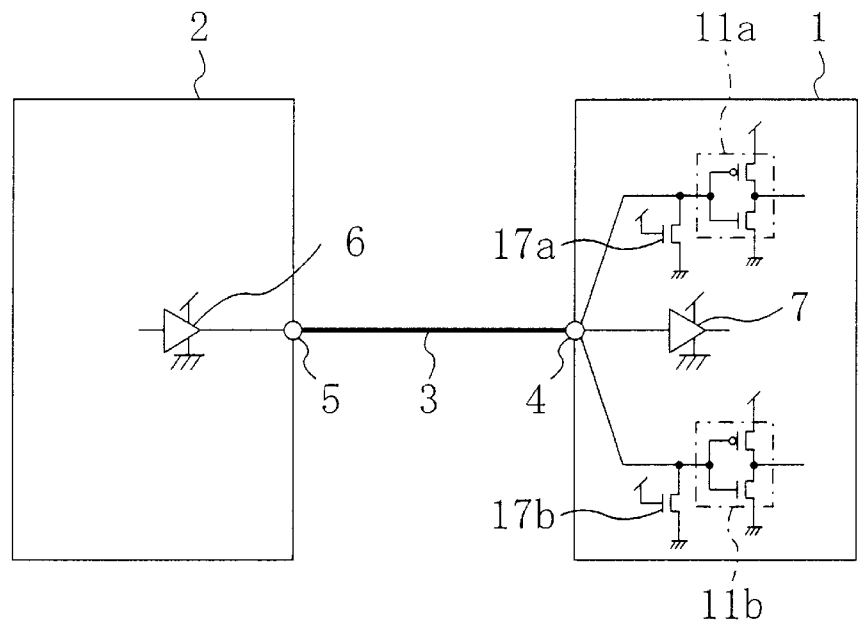

FIG. 4 illustrates an ABS compliant integrated circuit system according to a fourth embodiment of the present invention. In FIG. 4, the same components as those illustrated in FIG. 1 are identified by the same reference numerals and the detailed description thereof will be omitted herein. As shown in FIG. 4, pull-down devices 17a and 17b are connected to the inputs of the logic circuits 11a and 11b, respectively. In the embodiment illustrated in FIG. 4, the pull-down devices 17a and 17b are implemented as NMOS's. The respective gates of these NMOS's are connected to the power supply. Thus, the pull-down devices 17a and 17b are always ON.

These pull-down devices 17a and 17b are effectively applicable to the test of whether the interconnect 3 is disconnected. Specifically, if the interconnect 3 was disconnected, the potential at the terminal 4 would be inconstant and the test could not be carried out as intended without the pull-down devices 17a and 17b. In contrast, if the pull-down devices 17a and 17b are provided, the potential at the terminal 4 settles at the ground potential. Accordingly, when 0 or 5 V is output from the driver 6, the outputs of the logic circuits 11a and 11b are at the same level as the output of the driver 6 in either case. Thus, the disconnection of the interconnect 3 can be detected correctly.

However, if the impedance of the pull-down devices 17a and 17b is too small, then the potential at the terminal 4 is always at the ground potential and the test might not be carried out as intended. Accordingly, the pull-down devices 17a and 17b should be designed to have impedance high enough not to affect various tests other than the test of whether the interconnect 3 is disconnected. The maximum impedance of the pull-down devices 17a and 17b may be increased by extending the test time. In such a case, the effects of the pull-down devices 17a and 17b are negligible when various tests other than the interconnect disconnection test are carried out. Thus, the system shown in FIG. 4 is functionally equivalent to the system shown in FIG. 1, and the connectivity of the interconnect 3 can be tested as in the first embodiment.

As can be seen, according to this embodiment, even the disconnection of the interconnect can be tested stably.

In the illustrated embodiment, NMOS's are used as the pull-down devices. Optionally, any other devices may be used as the pull-down devices so long as the alternative devices can fix the potential at the terminal when the interconnect is disconnected and do not affect the operation of the system unless the interconnect is disconnected. Optionally, pull-up devices may be used instead of the pull-down devices.

Embodiment 5

Figure 5:
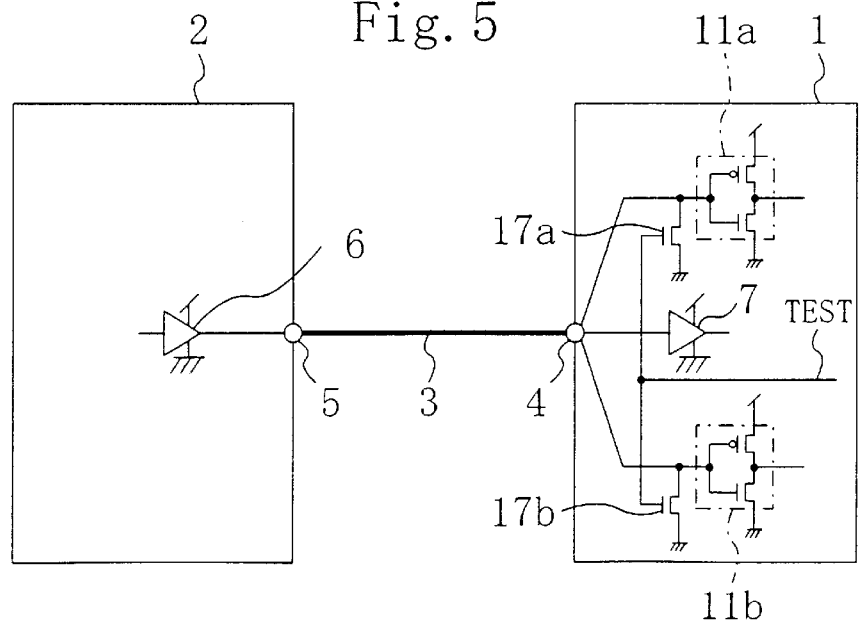

FIG. 5 illustrates an ABS compliant integrated circuit system according to a fifth embodiment of the present invention. In FIG. 5, the same components as those illustrated in FIG. 4 are identified by the same reference numerals and the detailed description thereof will be omitted herein. The system shown in FIG. 5 is different from the counterpart shown in FIG. 4 in that the test mode signal TEST is provided to the respective gates of the NMOS's as the pull-down devices 17a and 17b to selectively turn these devices 17a and 17b ON/OFF. Specifically, during normal operation, i.e., while no test is carried out using the logic circuits 11a and 11b, the pull-down devices 17a and 17b are electrically isolated from the inputs of the logic circuits 11a and 11b, respectively.

In carrying out a test of whether the interconnect 3 is normally connected, the test mode signal TEST is asserted logically high to turn the pull-down devices 17a and 17b ON. In such a situation, the system shown in FIG. 5 is functionally equivalent to the counterpart shown in FIG. 4, and the connectivity of the interconnect 3 can be tested as in the fourth embodiment.

On the other hand, during normal operation while no tests are carried out, the test mode signal TEST is negated logically low to turn the pull-down devices 17a and 17b OFF. Since no current flows through the pull-down devices 17a and 17b in such a case, unnecessary current dissipation during normal operation can be cut down.

As can be seen, according to this embodiment, the connectivity of the interconnect can be tested as in the fourth embodiment and the current flowing during normal operation can also be cut down.

Embodiment 6

Figure 6:
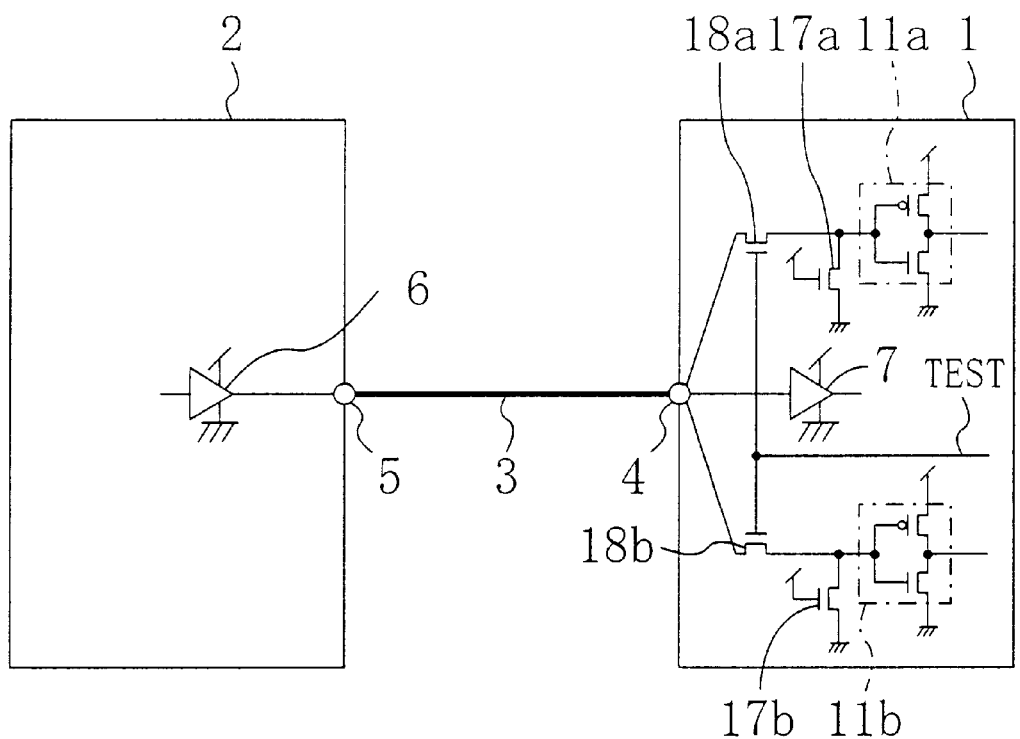
Figure 7:
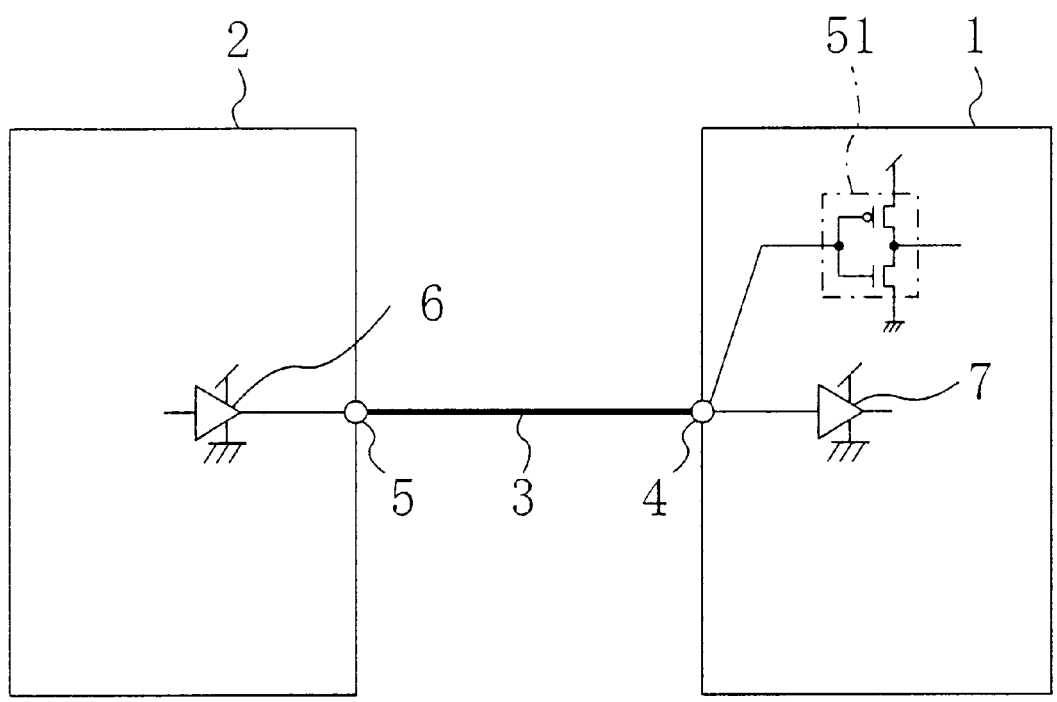
FIG. 7 illustrates a prior art ABS compliant integrated circuit system.
Figure 8A:
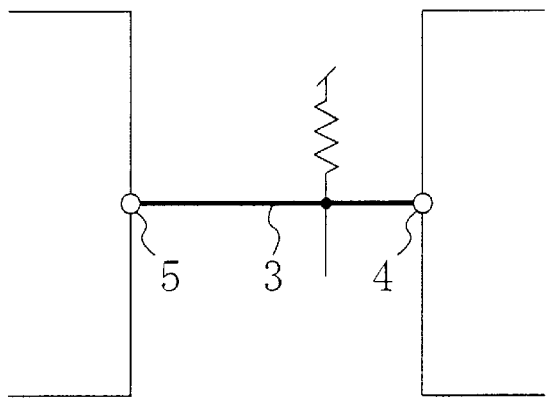
FIGS. 8(*a*) through 8(*c*) illustrate various faults that might be caused on an interconnect.
Figure 8B:
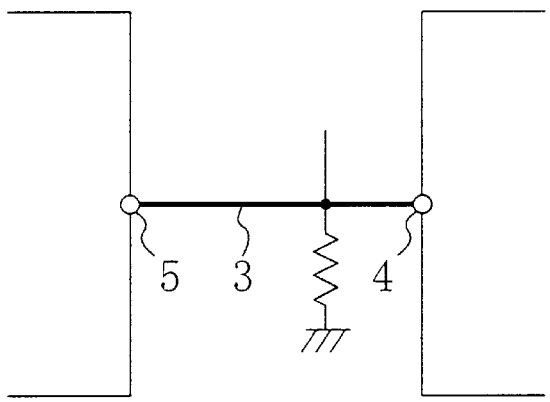
Figure 8C:
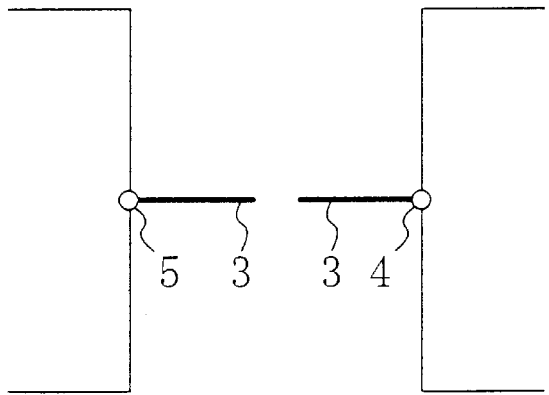

FIG. 6 illustrates an ABS compliant integrated circuit system according to a sixth embodiment of the present invention. In FIG. 6, the same components as those illustrated in FIG. 4 are identified by the same reference numerals and the detailed description thereof will be omitted herein. As shown in FIG. 6, input isolators 18a and 18b are further provided to electrically isolate the terminal 4 from the inputs of the logic circuits 11a and 11b during normal operation, i.e., while no tests are carried out using the logic circuits 11a and 11b. In the embodiment illustrated in FIG. 6, the input isolators 18a and 18b are implemented as NMOS's. The test mode signal TEST is provided to the respective gates of the NMOS's functioning as the input isolators 18a and 18b to selectively turn these isolators 18a and 18b ON/OFF.

In carrying out a test of whether the interconnect 3 is normally connected, the test mode signal TEST is asserted logically high to turn the input isolators 18a and 18b ON. As a result, the terminal 4 is electrically connected to the inputs of the logic circuits 11a and 11b. In such a situation, the system shown in FIG. 6 is functionally equivalent to the counterpart shown in FIG. 4, and the connectivity of the interconnect 3 can be tested as in the fourth embodiment.

On the other hand, during normal operation while no tests are carried out, the test mode signal TEST is negated logically low to turn the input isolators 18a and 18b OFF. Since no current flows through the pull-down devices 17a and 17b in such a case, unnecessary current dissipation during normal operation can be cut down.

During the normal operation, an analog signal sometimes passes through the interconnect 3 and the potential at the terminal 4 often becomes an intermediate potential close to the input threshold voltages of the logic circuits 11a and 11b. According to this embodiment, however, the inputs of the logic circuits 11a and 11b are electrically isolated from the terminal 4 by the input isolators 18a and 18b and the potentials of the logic circuits 11a and 11b are fixed by the pull-down devices 17a and 17b. Thus, no current flows through the logic circuits 11a and 11b. In addition, since the output potentials of the logic circuits 11a and 11b are also fixed, circuits on the stages succeeding the logic circuits 11a and 11b do not operate, either.

As can be seen, according to this embodiment, the connectivity of the interconnect can be tested as in the fourth embodiment and the current flowing during normal operation can be cut down.

In the illustrated embodiment, NMOS's are used as the input isolators. Optionally, any other devices may be used as the input isolators so long as the alternative devices can electrically isolate the terminal from the inputs of the logic circuits during normal operation and can connect the terminal to the inputs of the logic circuits during the test.

It should be noted that each of the fourth through sixth embodiments may be effectively combined with the second or third embodiment.

In the second through sixth embodiments, multiple logic circuits are provided. However, the same effects are attainable even if these embodiments are applied to a single logic circuit.

Also, in each of the first through sixth embodiments, the gate length of transistors included in the input stage of each logic circuit is preferably longer than a standard gate length of other transistors included in the integrated circuit. In that case, these input-stage transistors of the logic circuit, which often reach an intermediate potential during testing or normal operation, increase their resistance against hot carriers, thus improving the reliability of the integrated circuit system.

As is apparent from the foregoing description, the inventive system can test the connectivity of an interconnect more reliably either by providing multiple logic circuits with mutually different input threshold voltages or by providing pull-up or pull-down devices for the inputs of the logic circuits. Also, the current dissipation in the logic circuits and circuits on succeeding stages during normal operation can be cut down by providing power isolators or potential fixers. As a result, power consumption can be reduced during the normal operation.

What is claimed is:

1. An integrated circuit system with analog boundary scan capabilities, the system comprising:

first and second integrated circuits; and an interconnect provided between the first and second integrated circuits to connect these circuits together, wherein the first integrated circuit includes:
a terminal to which the interconnect is connected; and
multiple logic circuits with mutually different input threshold voltages, each said logic circuit detecting a logical level of a potential at the terminal to carry out a test of whether the interconnect is connected normally.

2. The system of claim 1, wherein a gate length of a transistor at an input stage of each said logic circuit is greater than that of another transistor included in the first integrated circuit.

3. An integrated circuit system with analog boundary scan capabilities, the system comprising:
first and second integrated circuits; and
an interconnect provided between the first and second integrated circuits to connect these circuits together,
wherein the first integrated circuit includes:
a terminal to which the interconnect is connected;
a logic circuit for detecting a logical level of a potential at the terminal to carry out a test of whether the interconnect is connected normally;
means for fixing an output potential of the logic circuit while the test is not carried out using the logic circuit; and
means for electrically isolating at least one of power supply and ground from the logic circuit to block current from flowing through the logic circuit while the test is not carried out using the logic circuit.

4. The system of claim 3, wherein an input threshold voltage of the logic circuit is defined depending on respective sizes of the fixing and isolating means.

5. The system of claim 4, wherein at least one logic circuit is provided in addition to the logic circuit, the former logic circuit being functionally equivalent to the latter logic circuit, and
wherein each of the logic circuits is associated with the fixing and isolating means individually, and
wherein mutually different input threshold voltages are defined for the logic circuits depending on respective sizes of the associated fixing and isolating means.

6. The system of claim 3, wherein a gate length of a transistor at an input stage of the logic circuit is greater than that of another transistor included in the first integrated circuit.

7. An integrated circuit system with analog boundary scan capabilities, the system comprising:
first and second integrated circuits; and
an interconnect provided between the first and second integrated circuits to connect these circuits together,
wherein the first integrated circuit includes:
a terminal to which the interconnect is connected;
a logic circuit for detecting a logical level of a potential at the terminal to carry out a test of whether the interconnect is connected normally; and
a pull-up or pull-down device connected to an input of the logic circuit.

8. The system of claim 7, wherein the pull-up or pull-down device is electrically isolated from the input of the logic circuit while the test is not carried out using the logic circuit.

9. The system of claim 7, further comprising means for electrically isolating the input of the logic circuit from the terminal while the test is not carried out using the logic circuit.

10. The system of claim 7, wherein a gate length of a transistor at an input stage of the logic circuit is greater than that of another transistor included in the first integrated circuit.

* * * * *